(12) United States Patent
Mazda

(10) Patent No.: US 7,235,962 B2
(45) Date of Patent: Jun. 26, 2007

(54) INDUCTOR-BASED CURRENT SENSING

(76) Inventor: Babak Mazda, 850 Jordan Ave. #B, Los Altos, CA (US) 94022

( * ) Notice: Subject to any disclaimer, the term of this patent is extended or adjusted under 35 U.S.C. 154(b) by 0 days.

(21) Appl. No.: 10/990,287

(22) Filed: Nov. 15, 2004

(65) Prior Publication Data

US 2005/0116699 A1     Jun. 2, 2005

Related U.S. Application Data

(60) Provisional application No. 60/523,299, filed on Nov. 17, 2003.

(51) Int. Cl.
*G01R 31/00*     (2006.01)
(52) U.S. Cl. .................... 324/96; 324/127; 361/154
(58) Field of Classification Search ............... 324/127, 324/244, 257, 225, 258, 254, 96, 76.11; 323/222, 323/210, 282–285; 361/154, 187
See application file for complete search history.

(56) References Cited

U.S. PATENT DOCUMENTS

| | | | |
|---|---|---|---|
| 4,045,658 A * | 8/1977 | Peltola et al. .................. | 702/86 |
| 4,992,751 A | 2/1991 | Attwood et al. | |
| 5,003,456 A * | 3/1991 | Forge .......................... | 363/89 |
| 5,621,603 A * | 4/1997 | Adamec et al. ............. | 361/154 |
| 5,777,512 A | 7/1998 | Tripathi | |
| 5,808,455 A * | 9/1998 | Schwartz et al. ........... | 323/271 |
| 6,670,799 B1 * | 12/2003 | Bull et al. ................ | 324/76.11 |
| 6,781,458 B2 | 8/2004 | Mazda | |

OTHER PUBLICATIONS

Supertex, Inc., "High Voltage Pulser Circuits", VN/VP-13 Series Application Not AN-D8m, May 16, 2001, pp. 1-4.
Acouster, Zetex, "50W Class D Audio Amplifier Evaluation Board", ZXCD50STEVAL, Issue 1, Jul. 2002, pp. 1-12.

* cited by examiner

*Primary Examiner*—Rajnikant B. Patel
(74) *Attorney, Agent, or Firm*—Beyer Weaver LLP

(57) ABSTRACT

A circuit for sensing a current in an inductor is described. Integrator circuitry is operable to generate a first signal representing an integration of a voltage across the inductor. Comparison circuitry is operable to generate a reset signal each time the first signal reaches either a positive or negative threshold. The reset signal is for resetting the integrator circuitry. Logic circuitry is operable to generate a count direction signal indicating which of the positive and negative thresholds was reached to generate the reset signal. Counter circuitry is operable to increment or decrement a count representing the current in the inductor in response to the reset and count direction signals.

17 Claims, 4 Drawing Sheets

INDUCTOR-BASED CURRENT SENSING

RELATED APPLICATION DATA

The present application claims priority under 35 U.S.C. 119(e) to U.S. Provisional Patent Application No. 60/523,299 for INDUCTOR-BASED CURRENT SENSING filed on Nov. 17, 2003, the entire disclosure of which is incorporated herein by reference for all purposes.

BACKGROUND OF THE INVENTION

The present invention relates to techniques for sensing currents in electronic circuits. More particularly, the present invention provides an inductor-based approach to current sensing.

In many electronic circuits and systems it may be desirable to monitor the current in an inductor for a variety of reasons, e.g., sensing overcurrent conditions in a switching amplifier or power supply. This is often accomplished by the introduction of additional circuit elements, e.g., sense resistors, which cause the system to dissipate additional power, may undesirably alter the signal being monitored, and result in additional costs. It is therefore desirable to provide techniques for sensing the current in an inductor which are not characterized by such disadvantages.

SUMMARY OF THE INVENTION

According to the present invention an inductor-based current sensing technique is provided. According to a specific embodiment of the invention, a circuit for sensing a current in an inductor is provided. Integrator circuitry is operable to generate a first signal representing an integration of a voltage across the inductor. Comparison circuitry is operable to generate a reset signal each time the first signal reaches either a positive or negative threshold. The reset signal is for resetting the integrator circuitry. Logic circuitry is operable to generate a count direction signal indicating which of the positive and negative thresholds was reached to generate the reset signal. Counter circuitry is operable to increment or decrement a count representing the current in the inductor in response to the reset and count direction signals.

According to another specific embodiment, a circuit for sensing current in an inductor is provided. First circuitry is operable to generate a first signal in response to a voltage across the inductor. The first signal represents an integration of the voltage and corresponds to a substantially linear region of operation of a passive integrator. Second circuitry is operable to generate a digital word representing the current in the inductor in response to the first signal.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known features may not have been described in detail to avoid unnecessarily obscuring the invention.

Figure 1:
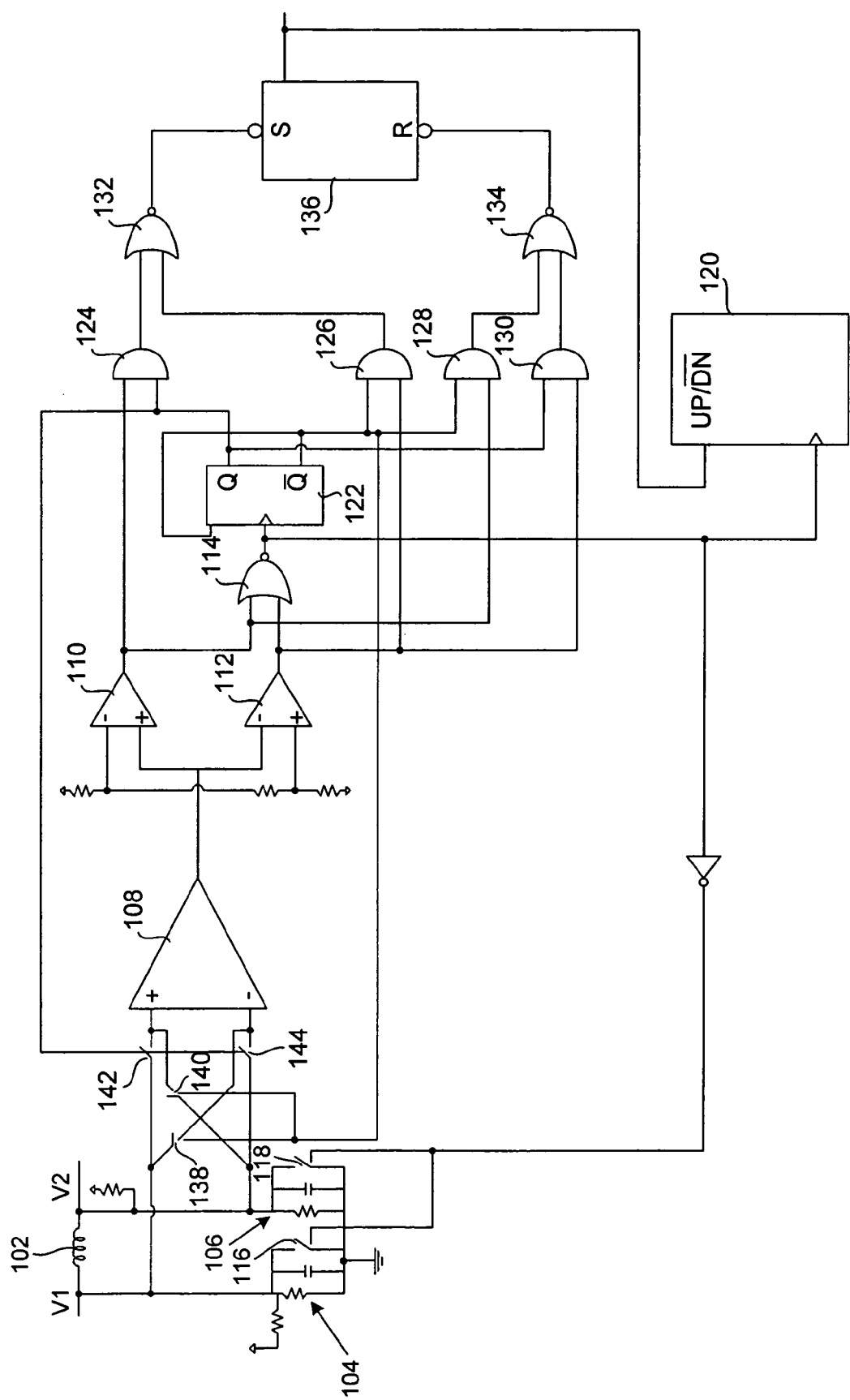
FIG. 1 is a schematic diagram of a circuit for sensing the current in an inductor according to a specific embodiment of the invention.

FIG. 1 shows a circuit 100 which may be used to sense the current flowing in an inductor 102. Inductor 102 may be part of any of a wide variety of electronic circuits, the details of which are not particularly relevant to the invention. An example of such a circuit might be the output LC filter of a switching amplifier or switching regulator. An example of a suitable switching amplifier topology is described in U.S. Pat. No. 5,777,512 for METHOD AND APPARATUS FOR OVERSAMPLED, NOISE-SHAPING, MIXED-SIGNAL PROCESSING issued Jul. 7, 1998, the entire disclosure of which is incorporated herein by reference for all purposes. However, it will be understood that the invention is not limited to this or any other particular application.

One of the advantages of the present invention is that it provides an approach to current sensing which is nearly lossless. That is, because the DC resistance of inductors is essentially zero, the losses typically associated with sense resistors are eliminated. The benefits of this will be apparent to those of skill in the art.

The voltage (V=V2−V1) across inductor 102 is given by:

$$V = L(dI/dt) \qquad (1)$$

Therefore, the current I in inductor 102 is given by:

$$I = 1/L \int (V2-V1) = 1/L (\int V2 - \int V1) \qquad (2)$$

Thus, the real-time current in inductor 102 can be represented as the integration of the voltage across the inductor.

Figure 2A:
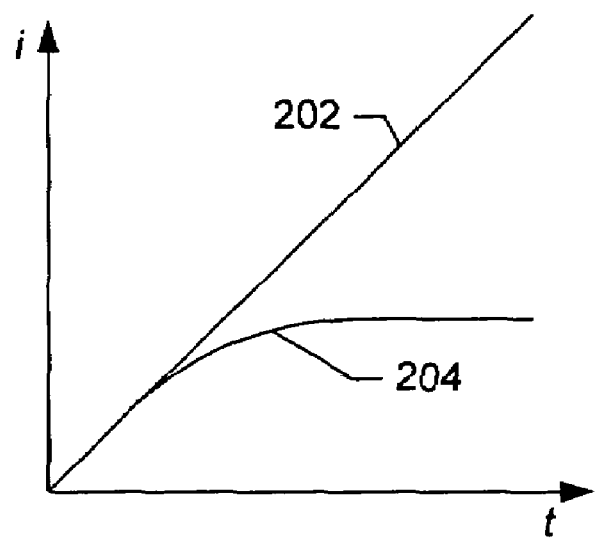
FIGS. 2a and 2b are graphs illustrating operation of a specific embodiment of the invention.

According to the embodiment shown, two passive integrators represented by RC circuits 104 and 106 integrate the voltages V1 and V2, respectively. However, because of the time constants associated with these RC circuits, they are not ideal integrators and can only accurately represent the integration of their respective voltages for a short period of time, i.e., while their response is still linear. An illustration of this phenomenon is shown in the exemplary graph of FIG. 2a.

In this example, it is assumed that the current in the inductor is increasing as represented by curve 202. As can be seen, the response of a passive RC integrator (represented by curve 204) integrating the voltage across the inductor tracks the current linearly until it decays according to its time constant. Thus, only the linear portion of the integrator's response may be employed to accurately represent the current. The manner in which this is accomplished according to a specific embodiment of the invention will now be described.

The difference between the integrator values is taken by differential amplifier 108 and then compared to a positive threshold (by comparator 110) and a negative threshold (by comparator 112). Once either of these thresholds is reached (due to the increasing magnitude of the current in inductor 102), the resulting voltage at the output of NOR gate 114 is used to control switches 116 and 118 which short (and thus resets) RC integrators 104 and 106, thereby preventing them from reaching the non-linear portions of their response curves.

Figure 2B:
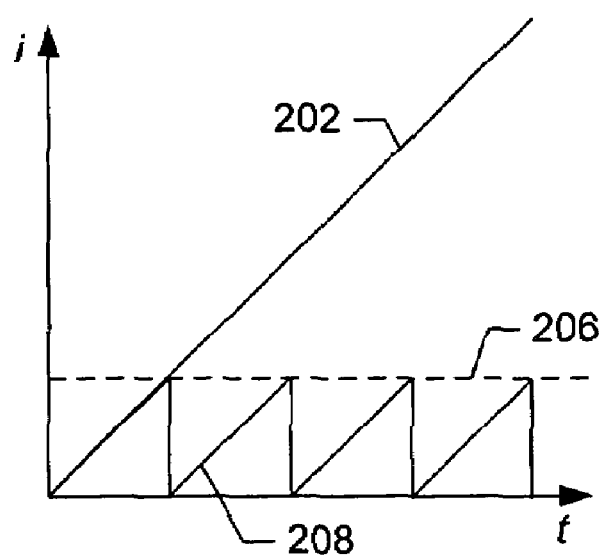

Referring to FIG. 2b, an exemplary threshold level is represented by dashed horizontal line 206). As shown, where current 202 is increasing monotonically, the resulting RC integrator output may be represented by a sawtooth curve 208. Thus, to track the actual value of the current in the inductor, the individual contributions of each "tooth" of curve 208 must be counted over time. This is accomplished in the circuit of FIG. 1 using up/down counter 120.

More particularly, each time the output of NOR gate 114 registers a threshold trip, the count in counter 120 is either incremented or decremented. Whether the count is incremented or decremented is determined by whether the positive or negative threshold was tripped. This is determined by logic comprising D flip-flop 122, AND gates 124–130, NOR gates 132 and 134, and R/S flip-flop 136. The output of R/S flip-flop 136 will reflect whether the positive or negative threshold was tripped (and thus whether the current in inductor 102 is increasing or decreasing), and will set counter 120 to either increment or decrement its count accordingly. Thus, each positive or negative contribution to the current in inductor 102 which is measured by passive integrators 104 and 106 is accumulated in a digital word in counter 120 which represents the real-time current in inductor 102.

The thresholds (set by the resistors associated with comparators 110 and 112) and the RC time constants (associated with circuits 104 and 106) determine how fast the current in the inductor is sampled. The faster the inductor current is sampled (i.e., either by decreasing the time constants or the thresholds), the greater the resolution associated with each count of the up/down counter, i.e., 1 bit would correspond to a smaller amount of current and therefore greater resolution. However, there are limitations on decreasing the value of R×C. That is, reducing R too far will undesirably increase power dissipation. In addition, reductions in the value of C are limited by the parasitic capacitances of the associated switches and the input capacitance of amplifier 108.

Because two passive integrators are employed in the embodiment described, it is important to ensure that differences in the values of the R's and C's in the respective integrators do not result in a positive or negative bias in the value being accumulated in counter 120. Therefore, according to a particular implementation, switch circuitry (i.e., switches 138–144) controlled by the complementary outputs of D flip-flop 122 alternately connect integrators 104 and 106 to the inverting and non-inverting inputs of differential amplifier 108. In the embodiment shown, this is done each time one of the thresholds is tripped. It should be noted that this could be done less frequently and still remain within the scope of the invention. In any case, by alternating the comparator inputs this way, any bias introduced by mismatched components in the integrators will tend toward zero.

Figure 3A:
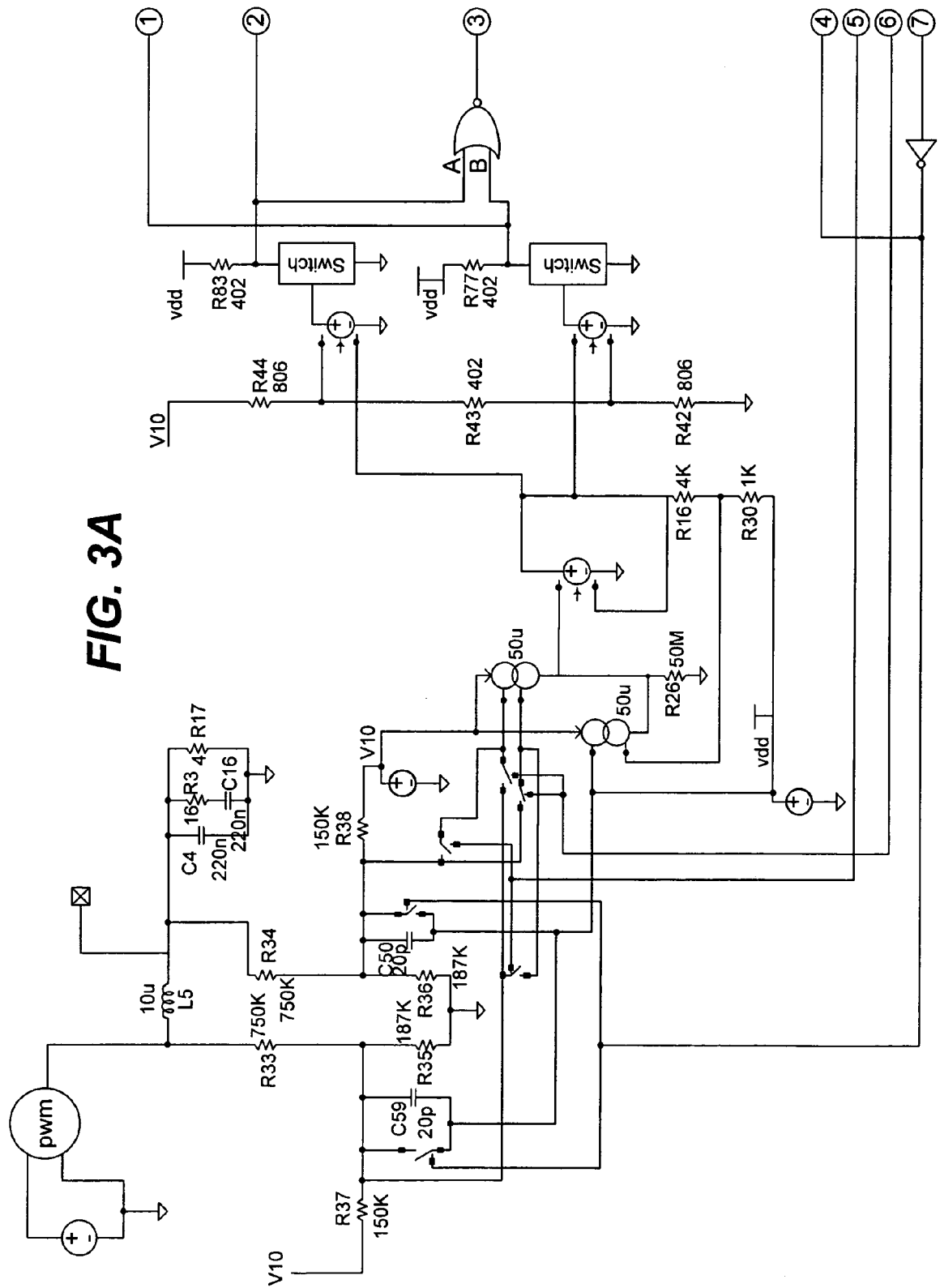
FIGS. 3a and 3b is a schematic diagram of a circuit for sensing the current in an inductor according to another specific embodiment of the invention.
Figure 3B:
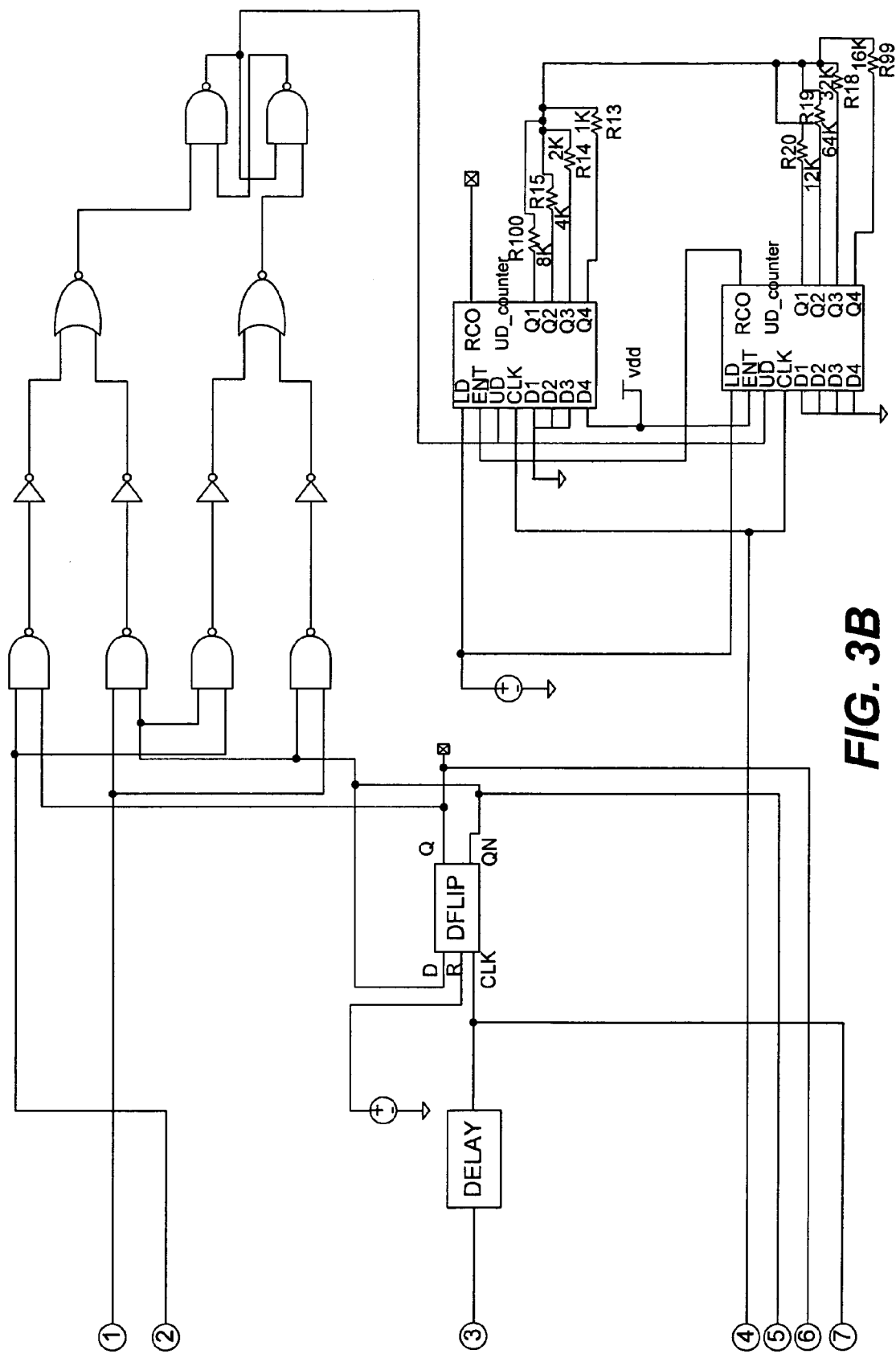

FIGS. 3a and 3b show a more detailed schematic of a specific embodiment of the invention in which component numbers and values are specified. It will be understood that these numbers and values are merely exemplary.

The present invention may be employed in any context in which the sensing, monitoring, or measuring of a current is useful. For example, embodiments of the present invention may be used to sense overcurrent conditions in any of a wide variety of amplifier topologies. In another example, embodiments of the present invention may be used to implement an ammeter. In yet another example, embodiments of the present invention may be employed to provide current sensing in switching power supplies. Many other potential applications will be apparent to those of skill in the art. All such applications of the present invention are within the scope of the invention.

While the invention has been particularly shown and described with reference to specific embodiments thereof, it will be understood by those skilled in the art that changes in the form and details of the disclosed embodiments may be made without departing from the spirit or scope of the invention. For example, the positive and negative threshold levels to which the integrated signal(s) is(are) compared may be set to capture more or less of the linear portions of the passive integrator response curves without departing from the invention. Moreover, instead of taking the difference between two integrated values, embodiments of the invention are contemplated in which the difference between two voltages, e.g., V1 and V2, is integrated by a single integrator. The passive integrators described herein might also be replaced by active integrators, e.g., op amp integrators. There are many other variations which will be appreciated by those of skill in the art as being within the scope of the invention.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A circuit for sensing a current in an inductor, comprising:
   integrator circuitry operable to generate a first signal representing an integration of a voltage across the inductor;
   comparison circuitry operable to generate a reset signal each time the first signal reaches either a positive or negative threshold, the reset signal being for resetting the integrator circuitry;
   logic circuitry operable to generate a count direction signal indicating which of the positive and negative thresholds was reached to generate the reset signal; and
   counter circuitry operable to increment or decrement a count representing the current in the inductor in response to the reset and count direction signals.

2. The circuit of claim 1 wherein the integrator circuitry comprises first and second passive integrators and the comparison circuitry comprises a comparator.

3. The circuit of claim 2 wherein the circuit further comprises switch circuitry for alternately connecting the first and second passive integrators to inverting and non-inverting inputs of the comparator, thereby at least partially canceling any bias introduced by mismatched components in the first and second passive integrators.

4. The circuit of claim 3 wherein the switch circuitry is operable to alternately connect the first and second passive integrators to the inverting and non-inverting inputs of the comparator each time either of the positive and negative thresholds is reached.

5. The circuit of claim 1 wherein the integrator circuitry comprises at least one active integrator.

6. The circuit of claim 1 wherein the positive and negative thresholds associated with the comparison circuitry correspond to a substantially linear region of operation of the integrator circuitry.

7. A switching amplifier comprising the circuit of claim 1, the switching amplifier further comprising the inductor and a capacitor, the inductor and the capacitor forming an output LC filter for the switching amplifier.

8. An ammeter comprising the circuit of claim 1.

9. A switching power supply comprising the circuit of claim 1.

10. A circuit for sensing current in an inductor comprising first circuitry operable to generate a first signal in response to a voltage across the inductor, the first signal representing an integration of the voltage and corresponding only to a substantially linear region of operation of a passive integrator, and second circuitry operable to generate a digital word representing the current in the inductor in response to the first signal.

11. The circuit of claim 10 wherein the first circuitry comprises comparison circuitry operable to generate a reset signal each time the first signal reaches either a positive or negative threshold, the reset signal being for resetting the passive integrator, wherein the positive and negative thresholds correspond to the substantially linear region of operation of the passive integrator.

12. The circuit of claim 11 wherein the second circuitry comprises logic circuitry operable to generate a count direction signal indicating which of the positive and negative thresholds was reached to generate the reset signal, and counter circuitry operable to increment or decrement a count representing the current in the inductor in response to the reset and count direction signals.

13. The circuit of claim 10 wherein the first circuitry comprises first and second passive integrators, and a comparator.

14. The circuit of claim 13 further comprising switch circuitry for alternately connecting the first and second passive integrators to inverting and non-inverting inputs of the comparator, thereby at least partially canceling any bias introduced by mismatched components in the first and second passive integrators.

15. A switching amplifier comprising the circuit of claim 10, the switching amplifier further comprising the inductor and a capacitor, the inductor and the capacitor forming an output LC filter for the switching amplifier.

16. An ammeter comprising the circuit of claim 10.

17. A switching power supply comprising the circuit of claim 10.

* * * * *